United States Patent [19]
Mori

[11] Patent Number: 5,208,174
[45] Date of Patent: May 4, 1993

[54] METHOD FOR MANUFACTURING A NONVOLATILE SEMICONDUCTOR MEMORY DEVICE

[75] Inventor: Seiichi Mori, Tokyo, Japan

[73] Assignee: Kabushiki Kaisha Toshiba, Kawasaki, Japan

[21] Appl. No.: 725,479

[22] Filed: Jul. 3, 1991

[30] Foreign Application Priority Data

Jul. 5, 1990 [JP] Japan ............................ 2-178083

[51] Int. Cl.$^5$ .................... H01L 21/265; H01L 21/70
[52] U.S. Cl. .......................................... 437/43; 437/52; 437/978; 437/983
[58] Field of Search .................. 437/43, 48, 52, 983, 437/44; 357/23.5; 365/185

[56] References Cited

U.S. PATENT DOCUMENTS

| | | | |
|---|---|---|---|
| 4,675,978 | 6/1987 | Swartz | 437/21 |
| 4,774,201 | 9/1988 | Woo et al. | 437/43 |
| 4,847,667 | 7/1989 | Mori | 365/185 |
| 4,972,371 | 11/1990 | Komori et al. | 365/185 |
| 4,982,250 | 1/1991 | Manos, II et al. | 357/23.5 |

FOREIGN PATENT DOCUMENTS

1-171229  7/1989  Japan ................................ 365/185

OTHER PUBLICATIONS

Wolf et al: "Silicon Processing for the VLSI Era" Lathze Press, Calif., 1986, pp. 183-185.

*Primary Examiner*—Olik Chaudhuri
*Assistant Examiner*—Loc Q. Trinh
*Attorney, Agent, or Firm*—Banner, Birch, McKie & Beckett

[57] ABSTRACT

According to a method for manufacturing a nonvolatile semiconductor memory device, first, a CVD oxidation film is formed in a side wall portion of a floating gate formed on a semiconductor substrate. Then, a thermal oxidation film is formed between said floating gate and said CVD oxidation film by a thermal oxidation method. Additionally, before forming said CVD oxidation film, a thermal oxidation film may be formed in the side portion of said floating gate.

18 Claims, 3 Drawing Sheets

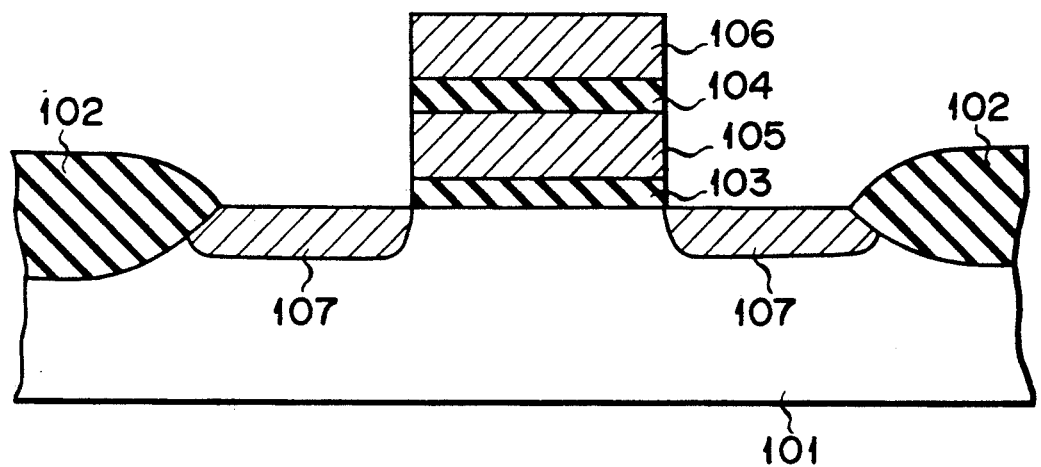
F I G. 2A
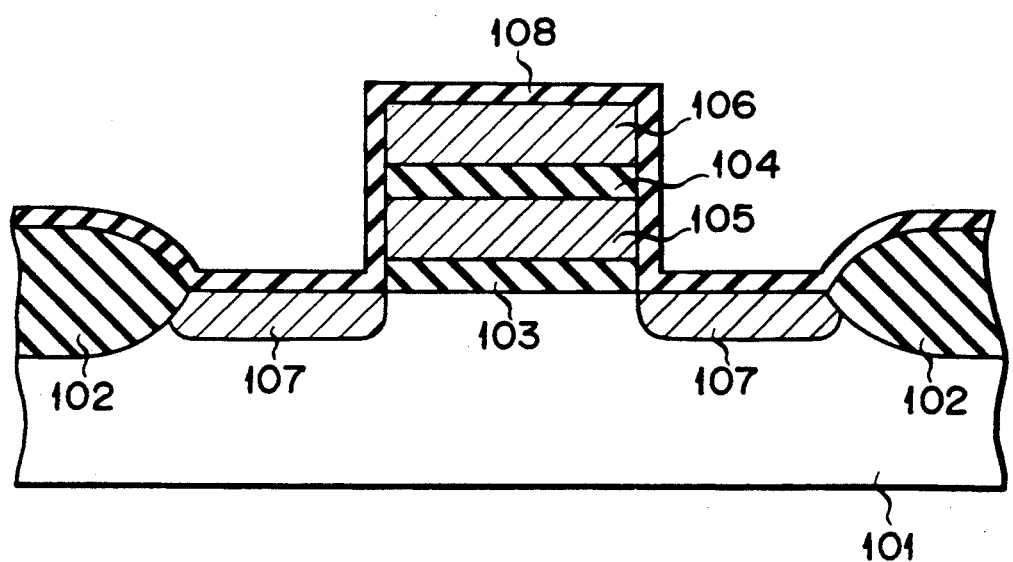
F I G. 2B

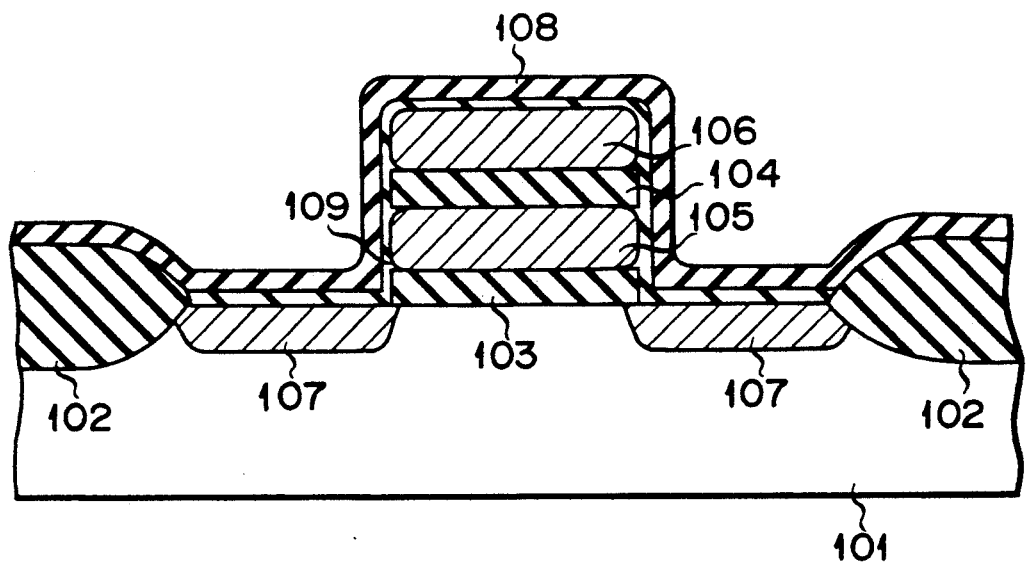
F I G. 2C
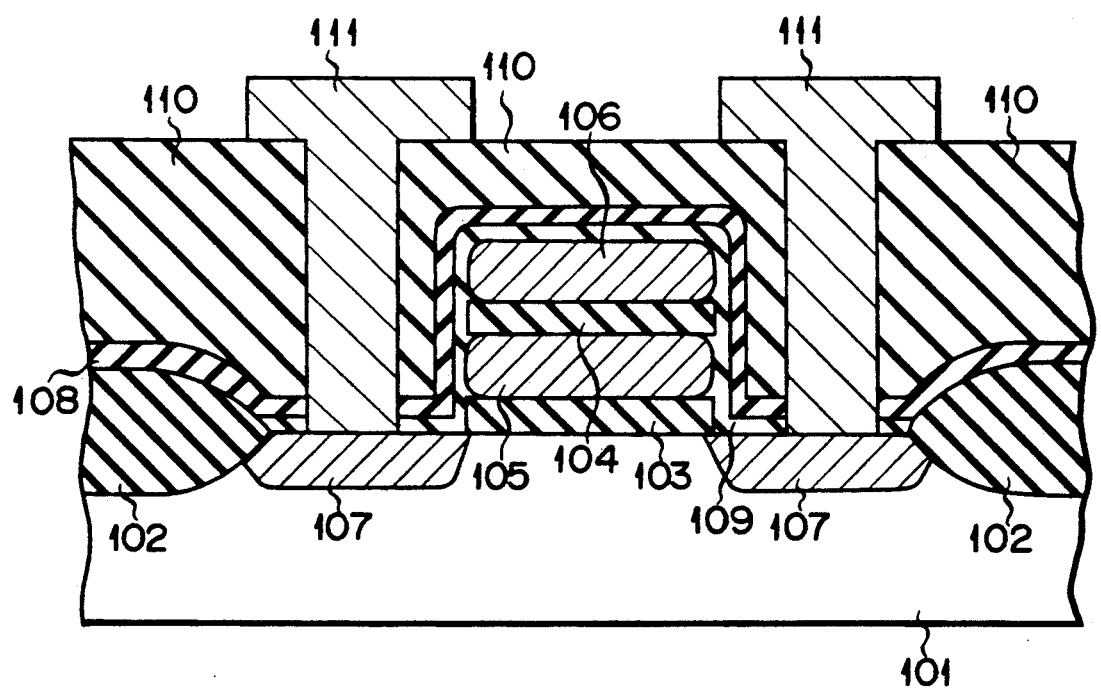
F I G. 2D

METHOD FOR MANUFACTURING A NONVOLATILE SEMICONDUCTOR MEMORY DEVICE

BACKGROUND OF THE INVENTION

1. Field of the Invention

The present invention relates to a method for manufacturing a nonvolatile semiconductor memory device storing an electron in a floating gate, and is particularly used in a memory device having a large capacity such as an EPROM, an EEPROM, and an FEEPROM.

2. Description of the Related Art

Conventionally, a nonvolatile semiconductor memory device, which stores an electron in a floating gate, such as a memory cell of an EPROM has a cross sectional structure as shown in FIG. 1. In FIG. 1, reference numeral 201 is a silicon substrate; 202: a source or drain diffusion layer; 203: a gate oxide film; 204: a floating gate; 205: a control gate; 206: a thermal oxide film; and 207: an interlayer insulating film.

The thermal oxide film 206 is formed around the floating gate of the EPROM to maintain the electric charge in the floating gate. The thermal oxide film 206 is formed by thermally oxidizing the floating gate, which is formed of polycrystalline silicon. Additionally, the thermal oxide film 206 having a sufficient thickness is formed at a high temperature in order to keep a characteristic of maintaining favorable electrical charge.

The formation of the thermal oxidation film 206 having a sufficient thickness at a high temperature is to prevent the following problems.

It cannot be said that the quality of the thermal oxide film 206, which is formed on the side surface of the floating gate 204, is high. Due to this, if the distance between the edge portion of the floating gate 204 and the source or drain diffusion layer 202 is close to each other, high electrical filed is applied between the edge portion and the the source or drain diffusion layer 202, so that the electric charge in the floating gate 204 is easily moved out of the floating gate. Particularly, if the edge portion of the floating gate 204 is sharpened to form an acute angle, the electrical field is further concentrated on the portion between the edge portion and the the source or drain diffusion layer 202, so that electric charge is easily moved out of the floating gate. Due to this, the thermal oxide film 206 having a sufficient thickness is formed at a high temperature, and the edge portion of the floating gate 204 is rounded, thereby controlling the electric charge passing through a passage ①. Moreover, a large amount of phosphorus (P) is contained in the interlayer insulating film 207 (e.g., PSG film) formed on the thermal oxide film 206. In other words, the quality of the interlayer insulating film 207 is low and the electric charge is easily passed through. Due to this, the thermal oxide film 206 having a sufficient thickness is formed, thereby controlling the electric charge passing through a passage ②. Moreover, there is a case in which the floating gate 204 contains a large amount of impurity materials and its side surface is often contaminated. Due to this, in order to improve the quality of the thermal oxide film 206, it is required that the thermal oxide film 206 be formed to have a sufficient thickness at a high temperature.

However, if the thermal oxide film 206 is oxidized at a high temperature for a long time, the contact surface between the substrate 201 and the source or drain diffusion layer 202 is formed at a deep position. Due to this, there is a problem in that the characteristic of the device is deteriorated. Moreover, if the oxidation time is too long, the thermal oxide film 206 enters between the floating gate and the control gate 205, so that the thickness of a thermal oxidation film 208 between the floating gate 204 and the control gate 205 is increased. In this case, there is a problem in that the capacity between the floating gate 204 and the control gate 205 decreases and the characteristic of the device decreases. Particularly, the decrease in the capacity largely influences on a device such as a fined memory cell having a short channel length.

SUMMARY OF THE INVENTION

The present invention has been made in order to solve the above-mentioned problems. An object of the present invention is to provide a method for manufacturing a nonvolatile semiconductor memory device wherein a thermal oxidation film having high quality can be formed even at a low temperature and for a long oxidation time and characteristic of maintaining favorable electric charge can be obtained.

In order to achieve the above object, according to the method for manufacturing a nonvolatile semiconductor memory device of the present invention, there is formed a first oxidation film in a side wall portion of a floating gate formed on a semiconductor substrate by a CVD method. Thereafter, there is formed a second oxidation film between the floating gate and the first oxidation film by a thermal oxidation method.

Moreover, according to the method for manufacturing a nonvolatile semiconductor memory device of the present invention, there is formed the first oxidation film in the side wall portion of the floating gate by the thermal oxidation method. Next, the second oxidation film is formed in the side wall of the floating gate formed on the semiconductor substrate by the CVD method. Thereafter, a third oxidation film is formed between the floating gate and the second oxidation film by the thermal oxidation method.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 2A to 2D are cross sectional views showing a method for manufacturing a nonvolatile semiconductor memory device relating to one embodiment of the present invention.

DETAILED DESCRIPTION OF THE PREFERRED EMBODIMENTS

Figure 1:
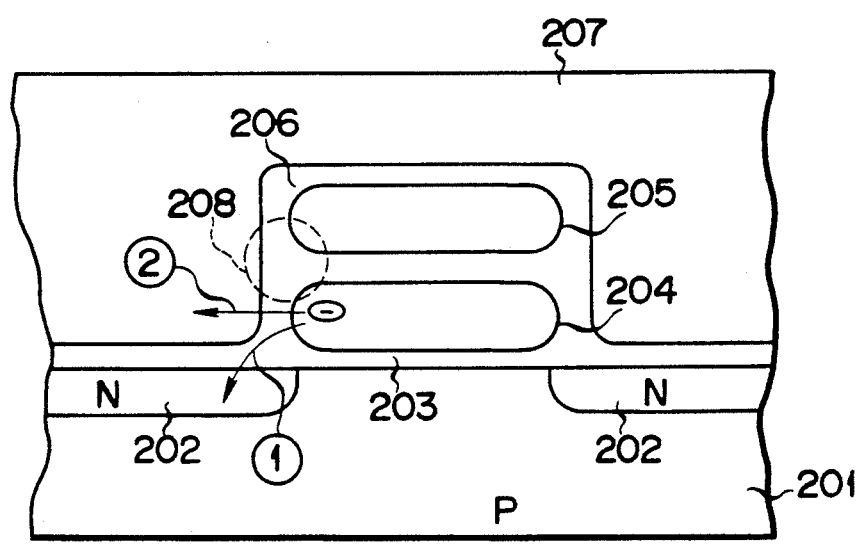
FIG. 1 is a cross sectional view showing a conventional nonvolatile semiconductor memory device.

The embodiments of the present invention will be explained with reference to the drawings.

FIGS. 2A to 2D show one embodiment of the present invention in which the present invention is applied to an EPROM.

As shown in FIG. 2A, an element separation oxidation film 102 is formed on a P type silicon substrate 101. A silicon oxidation film 103 is formed on the substrate 101. A polycrystalline silicon film 105 is formed on the silicon oxidation film 103. A silicon oxidation film 104 is formed on the polycrystalline silicon film 105. A polycrystalline silicon film 106 is formed on the silicon oxidation film 104. Thereafter, the silicon oxidation films 103 and 104 and the polycrystalline silicon films 105 and 106 are etched by self-aligning. As a result, there are formed gate oxidation films 103 and 104, a floating gate 105, and a control gate 106. Thereafter, an ion is implanted into the substrate 101, and a source and drain region 107 is formed.

Next as shown in FIG. 2B, a silicon oxidation film 108 of about 400 Å, which does not include impurity materials, is deposited on the entire surface of the portion exposed on the substrate y an LPCVD method. More specifically, the silicon oxidation film log can be formed by the following two methods.

In the first method, Si $(OC_2H_5)_4$ is decomposed at temperature of about 700° C., thereby an $SiO_2$ film (TEOS oxidation film) can be formed. In the second method, $SiCl_2H_2$ and $N_2O_2$ are reacted with each other, thereby an $SiO_2$ film can be formed. If LPCVD method is used, the silicon oxidation film 108 is evenly formed on the side surface of the floating gate 105.

Next, as shown in FIG. 2C, oxidization is performed in an ambient atmosphere of oxygen gas at temperature of about 900° C. for about 10 minutes, so that a thermal oxidation film 109 is formed between the floating gate 105 and the silicon oxidation film 108. As a result, the edge portion of the floating gate 105 is rounded, thereby preventing the electrical charge from being moved out of the edge portion.

Next, as shown in FIG. 2D, there is formed an oxidation film in which a large amount of phosphorus is doped in the entire surface of the portion exposed on the substrate. Also, a contact hole reaching the source or drain region 107 is formed in the interlayer insulating film 110. Thereafter, a metal wiring layer 111 is formed, thereby a memory cell of EPROM is completed.

According to the above method, the insulating film surrounding the floating gate 105 is formed of the double-layered structure of the silicon oxidation film (CVD oxidation film) 108 and the thermal oxidation film 109. Due to this, no damage occurs in the insulating film surrounding the floating gate 105, thereby improving the characteristic of maintaining the electrical charge. Moreover, in a case where the thermal oxidation is performed, the edge portion of the floating gate 105 is easily rounded even if oxidation is performed at relatively low temperature since oxidation advances at a rate-determining diffusion. In other words, unlike the rate-determining reaction in a case where thermal oxidation is directly performed as in the conventional case, the edge portion can be rounded even at relatively low temperature since stress is relaxed. For this reason, there can be provided an EPROM having a characteristic of maintaining favorable electrical charge, and the device can be appropriately fined.

In the above embodiment, the silicon oxidation film 108 does not include impurity materials. However, a small amount of phosphorus (P) may be included therein. For example, if concentration of phosphorus of the PSG film used as interlayer insulating film 110 is $1 \times 10^{21} cm^{-3}$ and that of the silicon oxidation film 108 is below $1 \times 10^{21} cm^{-3}$, the film quality can be prevented from being deteriorated by phosphorus.

Moreover, before the silicon oxidation film 108 is deposited, the floating gate 105 and the control gate 106 are thermally oxidized and relatively thin thermal oxidation films may be formed. Due to this, adherence of the silicon oxidation film 108, which is formed by the LPCVD method, can be improved.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method for manufacturing a nonvolatile semiconductor memory device having a floating gate transistor in an element region on a major surface of a body of semiconductor material, the method comprising the steps of:
   depositing a first oxidation film on a side wall portion of a floating gate of said floating gate transistor using a CVD method; and
   subsequently forming a second oxidation film between said floating gate and said first oxidation film.

2. The method for manufacturing a nonvolatile semiconductor memory device according to claim 1, wherein said first oxidation film is formed by decomposing $Si(OC_2H_5)_4$ at temperature of about 700° C.

3. The method for manufacturing a nonvolatile semiconductor memory device according to claim 1, wherein said first oxidation film is formed by reacting $SiCl_2H_2$ and $N_2O$ with each other at temperature of about 900° C.

4. The method for manufacturing a nonvolatile semiconductor memory device according to claim 1, wherein said first oxidation film does not include impurity material.

5. The method for manufacturing a nonvolatile semiconductor memory device according to claim 1, wherein said first oxidation film includes impurity material whose concentration is below $1 \times 10^{21} cm^{-3}$.

6. A method for manufacturing a nonvolatile semiconductor memory device having a floating gate transistor in an element region on a major surface of a body of semiconductor material, the method comprising the steps of:
   forming a first oxidation film on a side wall portion of a floating gate of said floating gate transistor using a thermal oxidation method;
   depositing a second oxidation film on the side wall portion of said floating gate using a CVD method;
   subsequently forming a third oxidation film between said floating gate and said second oxidation film.

7. The method for manufacturing a nonvolatile semiconductor memory device according to claim 6, wherein said second oxidation film is formed by decomposing $Si(OC_2H_5)_4$ at temperature of about 700° C.

8. The method for manufacturing a nonvolatile semiconductor memory device according to claim 6, wherein said second oxidation film is formed by reacting $SiCl_2H_2$ and $N_2O$ with each other at temperature of about 900° C.

9. The method for manufacturing a nonvolatile semiconductor memory device according to claim 6, wherein said second oxidation film does not include impurity material.

10. The method for manufacturing a nonvolatile semiconductor memory device according to claim 6, wherein said second oxidation film includes impurity material whose concentration is below $1 \times 10^{21} cm^{-3}$.

11. A method for manufacturing a non-volatile semiconductor memory device, the method comprising the steps of:
 forming a first gate electrode insulatively spaced from a major surface of a body of semiconductor material and a second gate electrode superposed on and insulatively spaced from said first gate electrode;
 depositing a first oxidation film on said first and second gate electrodes; and
 thermally oxidizing a resultant structure to round edges of said first gate electrode and thereby forming a second oxidation film between said first oxidation film and said first and second gate electrodes.

12. The method according to claim 11, wherein the step of depositing a first oxidation film comprises depositing a first oxidation film by a low pressure chemical vapor deposition method.

13. The method according to claim 11, wherein the step of depositing a first oxidation film comprises:
 decomposing $Si(OC_2H_5)_4$ at a temperature of about 700° C.

14. The method according to claim 11, wherein the step of depositing a first oxidation film comprises:
 reacting $SiCl_2H_2$ with $N_2O$.

15. The method according to claim 11, wherein the step of thermally oxidizing a resultant structure comprises thermally oxidizing a resultant structure in an ambient atmosphere of oxygen gas.

16. The method according to claim 15, wherein the step of thermally oxidizing a resultant structure is carried out at a temperature of about 900° C.

17. The method according to claim 11, wherein the first oxidation film is deposited to a thickness of 400 Ångstroms.

18. The method according to claim 11, further comprising the step of:
 thermally oxidizing said first and second gate electrodes to form a thermal oxidation film prior to depositing said first oxidation film.

* * * * *